US012184266B2

(12) United States Patent
Tseng et al.

(10) Patent No.: US 12,184,266 B2
(45) Date of Patent: Dec. 31, 2024

(54) ELECTRONIC PACKAGE STRUCTURE

(71) Applicant: Advanced Semiconductor Engineering, Inc., Kaohsiung (TW)

(72) Inventors: Chi Sheng Tseng, Kaohsiung (TW); Lu-Ming Lai, Kaohsiung (TW); Ching-Han Huang, Kaohsiung (TW); Kuo-Hua Lai, Kaohsiung (TW); Hui-Chung Liu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 67 days.

(21) Appl. No.: 18/112,464

(22) Filed: Feb. 21, 2023

(65) Prior Publication Data
US 2023/0208394 A1 Jun. 29, 2023

Related U.S. Application Data

(63) Continuation of application No. 16/794,112, filed on Feb. 18, 2020, now Pat. No. 11,588,470.

(51) Int. Cl.
*H03L 1/04* (2006.01)
*H03H 3/007* (2006.01)
(Continued)

(52) U.S. Cl.
CPC ........ *H03H 9/2426* (2013.01); *H03H 3/0073* (2013.01); *H03H 9/0547* (2013.01);
(Continued)

(58) Field of Classification Search
CPC ............ H03H 3/0073; H03H 9/02448; H03H 9/0547; H03H 9/08; H03H 9/10;
(Continued)

(56) References Cited

U.S. PATENT DOCUMENTS 4,985,687 A 1/1991 Long
5,917,272 A 6/1999 Clark et al.
(Continued)

FOREIGN PATENT DOCUMENTS

CN 1929117 A 3/2007
CN 107204743 A 9/2017
(Continued)

OTHER PUBLICATIONS

Office Action for corresponding Taiwan Patent Application No. 109114152. issued on Jun. 30, 2023, 5 pages.
(Continued)

*Primary Examiner* — Levi Gannon
(74) *Attorney, Agent, or Firm* — FOLEY & LARDNER LLP

(57) ABSTRACT

The present disclosure provides a semiconductor package structure. The semiconductor package structure includes a substrate, a first electronic component and a support component. The first electronic component is disposed on the substrate. The first electronic component has a backside surface facing a first surface of the substrate. The support component is disposed between the backside surface of the first electronic component and the first surface of the substrate. The backside surface of the first electronic component has a first portion connected to the support component and a second portion exposed from the support component.

10 Claims, 8 Drawing Sheets

(51) Int. Cl.
  *H03H 9/05* (2006.01)
  *H03H 9/08* (2006.01)
  *H03H 9/10* (2006.01)
  *H03H 9/24* (2006.01)
  *H03L 1/02* (2006.01)

(52) U.S. Cl.
  CPC ............ *H03H 9/08* (2013.01); *H03H 9/1057* (2013.01); *H03L 1/028* (2013.01); *H03L 1/04* (2013.01)

(58) Field of Classification Search
  CPC ...... H03H 9/1057; H03H 9/2426; H03L 1/02; H03L 1/028; H03L 1/04
  See application file for complete search history.

(56) References Cited

U.S. PATENT DOCUMENTS

| | | | |
|---|---|---|---|
| 6,049,256 A | | 4/2000 | Fry |
| 6,501,340 B1 * | | 12/2002 | Flood ........................ H03L 1/04 310/318 |
| 7,589,599 B2 | | 9/2009 | Wacker |
| 9,178,469 B2 | | 11/2015 | Kondo |
| 9,287,881 B2 | | 3/2016 | Shimodaira et al. |
| 10,298,239 B2 | | 5/2019 | Obata et al. |
| 10,812,017 B1 * | | 10/2020 | Tseng .................... H01L 23/145 |
| 2006/0132251 A1 * | | 6/2006 | Satoh ........................ H03L 1/04 331/158 |
| 2006/0192626 A1 | | 8/2006 | Milliren et al. |
| 2006/0255457 A1 | | 11/2006 | Sutardja |
| 2006/0290239 A1 | | 12/2006 | Kasahara et al. |
| 2007/0035214 A1 | | 2/2007 | Kasahara |
| 2007/0268078 A1 | | 11/2007 | Lee |
| 2008/0233669 A1 | | 9/2008 | Hirakata et al. |
| 2010/0164635 A1 * | | 7/2010 | Kudo .................... H05K 1/0212 331/158 |
| 2012/0133427 A1 | | 5/2012 | Kim et al. |
| 2012/0161887 A1 | | 6/2012 | Ito et al. |
| 2015/0021632 A1 | | 1/2015 | Taghizadeh et al. |
| 2017/0219301 A1 | | 8/2017 | Lin |
| 2017/0272082 A1 | | 9/2017 | Obata et al. |
| 2018/0131324 A1 | | 5/2018 | Granger et al. |
| 2018/0162722 A1 | | 6/2018 | Male et al. |
| 2018/0198408 A1 * | | 7/2018 | Owaki ...................... H03L 1/02 |
| 2019/0165759 A1 | | 5/2019 | Nishizawa et al. |

FOREIGN PATENT DOCUMENTS

| | | | |
|---|---|---|---|
| TW | 200407368 A | 5/2004 | |
| TW | 200746306 A | 12/2007 | |
| TW | 200847500 A | 12/2008 | |
| TW | 201230255 A | 7/2012 | |
| WO | WO-2008/035932 A | 3/2008 | |

OTHER PUBLICATIONS

Search Report with English translation for corresponding Taiwan Patent Application No. 109114152, issued Jun. 30, 2023, 3 pages.
Final Office Action for U.S. Appl. No. 16/794,112, issued Aug. 5, 2022, 12 pages.
Non-Final Office Action for U.S. Appl. No. 16/794,112, issued Apr. 26, 2022, 19 pages.
Notice of Allowance for U.S. Appl. No. 16/794,112, issued Oct. 19, 2022, 9 pages.
Office Action from corresponding Taiwan Patent Application No. 112150468, issued Jul. 29, 2024, 14 pages.
Search Report with English translation from corresponding Taiwan Patent Application No. 112150468, issued Jul. 29, 2024, 3 pages.
Office Action from corresponding Chinese Patent Application No. 202010466454.3, issued on Nov. 1, 2024, 7 pages.
Search Report with English translation from corresponding Chinese Patent Application No. 20201046654.3, issued Nov. 1, 2024, 4 pages.

* cited by examiner

ELECTRONIC PACKAGE STRUCTURE

CROSS-REFERENCE TO RELATED APPLICATION

This application is a continuation of U.S. patent application Ser. No. 16/794,112 filed Feb. 18, 2020, now issued as U.S. Pat. No. 11,588,470, the contents of which is incorporated herein by reference in its entirety.

BACKGROUND

1. Technical Field

The present disclosure relates to a semiconductor package structure, particularly to a semiconductor package structure having an oscillator chip.

2. Description of the Related Art

A crystal oscillator includes a crystal unit composed of a quartz crystal blank hermetically encapsulated in a container and an oscillation circuit that uses the crystal unit. The crystal oscillator is used in various electronic apparatuses as a reference source for frequency and time. One of such crystal oscillator is an oven-controlled crystal oscillator (OCXO) that maintains operating temperature of the crystal unit constant. Since the operating temperature of the crystal unit is maintained constant regardless of ambient temperature, OCXO offers particularly high frequency stability, and exhibits little frequency deviation. Such OCXO is used in, for example, communication facilities such as base stations.

SUMMARY

In some embodiments, a semiconductor package structure includes a substrate, a first electronic component and a support component. The first electronic component is disposed on the substrate. The first electronic component has a backside surface facing a first surface of the substrate. The support component is disposed between the backside surface of the first electronic component and the first surface of the substrate. The backside surface of the first electronic component has a first portion connected to the support component and a second portion exposed from the support component.

In some embodiments, a semiconductor package structure includes a substrate, a first electronic component, a first insulator and a second insulator. The first electronic component is disposed on the substrate. The first electronic component has a backside surface facing a first surface of the substrate. The first insulator and a second insulator are disposed between the backside surface of the first electronic component and the first surface of the substrate. An equivalent thermal resistance of the first insulator and the second insulator is greater than a thermal resistance of the substrate.

In some embodiments, a method of manufacturing a semiconductor package structure includes (a) providing a ceramic substrate having a cavity; (b) disposing an insulator on a bottom surface of the cavity; and (c) disposing a first electronic component on the insulator, a backside surface of the first electronic component having a first portion connected to the insulator and a second portion exposed from the insulator.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
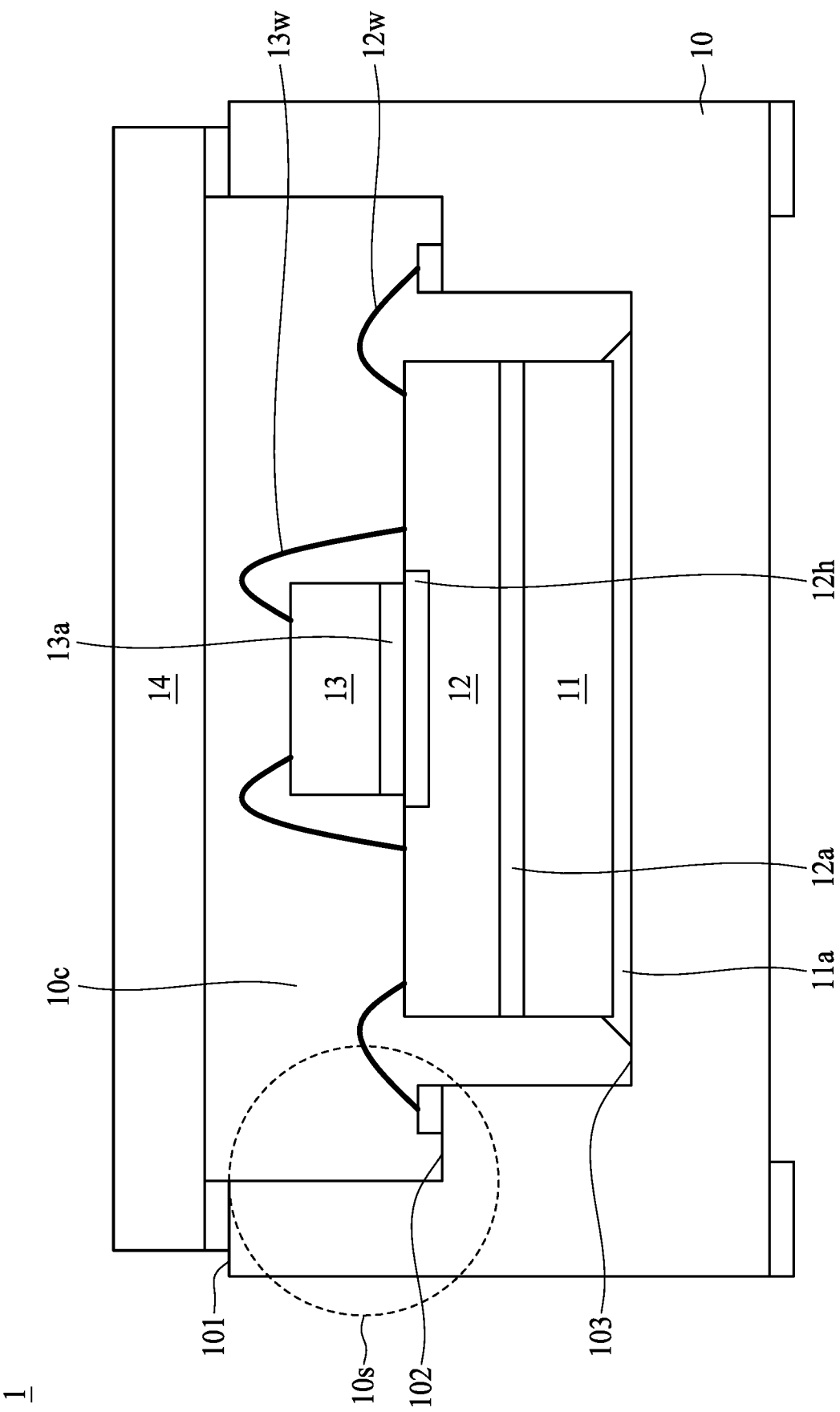
FIG. 1 illustrates a cross-sectional view of a semiconductor package structure, according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

To maintain the crystal unit in the OCXO at a constant temperature, a thermostatic device is generally used. With increasing miniaturization of communication facilities, the OCXO needs to be small. OCXO having a microelectromechanical system (MEMS) oscillator adopts a complicated stacking structure or high cost material to enhance the temperature control ability. For example, the MEMS oscillator and the oscillation circuit may be packaged on a ceramic cavity substrate, and hermetically sealed by a lid over the ceramic cavity substrate. Since the thermal conductivity of ceramic is considered high, for example, greater than 15 $W·m^{-1}K^{-1}$ (aluminum oxide), or greater than 150 $W·m^{-1}K^{-1}$ (aluminum nitride), an insulating layer with lower thermal conductivity, for example, about 1 $W·m^{-1}·K^{-1}$ (glass) is inserted to space the MEMS oscillator and the oscillation circuit apart from the ceramic cavity substrate, so as to maintain the crystal unit in the OCXO at a constant temperature. Nevertheless, the implementation of a ceramic cavity substrate and the additional insulating layer add to manufacturing cost.

Moreover, the thermal conductivity of the insulating layer (e.g., glass) still cannot effectively prevent heat loss from the crystal oscillator and the oscillation circuit so that more power has to be provided to keep the crystal oscillator and the oscillation circuit at constant temperature.

Present disclosure uses an air cavity or a vacuum cavity as a heat conduction retardation zone to prevent the heat loss from the crystal oscillator and the oscillation circuit. Since air has a thermal conductivity of about 0.026 $W \cdot m^{-1} \cdot K^{-1}$, which is substantially lower than the thermal conductivity of an insulating material such as glass, heat loss from the crystal oscillator and the oscillation circuit can be effectively reduced. Thermal conductivity of vacuum is even lower than that of air. In another aspect of the present disclosure, present disclosure provides an organic substrate for the packaging of the crystal oscillator and the oscillation circuit. Polymeric component of an organic substrate possesses a lower thermal conductivity (<1 $W \cdot m^{-1} \cdot K^{-1}$) than that of the ceramic substrate, and is more cost effective compared to the ceramic cavity substrate and the additional insulating layer such as glass. For example, a molding material-based substrate has a thermal conductivity of about 0.8 to 1 $W \cdot m^{-1} \cdot K^{-1}$, a polyimide substrate has a thermal conductivity of about 0.1 to 0.2 $W \cdot m^{-1} \cdot K^{-1}$, a FR-4 substrate has a thermal conductivity of about 0.3 $W \cdot m^{-1} \cdot K^{-1}$, a liquid crystalline polymer (LCP) substrate has a thermal conductivity of about 0.3 to 0.5 $W \cdot m^{-1} \cdot K^{-1}$, a solder mask layer on an organic substrate has a thermal conductivity of about 0.2 to 0.3 $W \cdot m^{-1} \cdot K^{-1}$. With the combination of organic substrate and the air cavity, not only the manufacturing cost can be reduce, also the power consumption keeping the crystal oscillator and the oscillation circuit at constant temperature can be reduced.

FIG. 1 illustrates a cross-sectional view of a semiconductor package structure 1, in accordance with some embodiments of the present disclosure. The semiconductor package structure 1 includes a substrate 10, an insulator 11, electronic components 12, 13 and a lid 14.

The substrate 10 may be an organic substrate including, but not limited to, a molding material-based substrate, a polyimide substrate, a FR-4 substrate, a liquid crystalline polymer (LCP) substrate, a core substrate, a coreless substrate, or other substrate composed of organic small molecules or polymers. In some embodiments, polymeric component of the organic substrate possesses a thermal conductivity less than about 1 $W \cdot m^{-1} \cdot K^{-1}$. In some embodiments, the substrate 10 define a cavity 10c to accommodate the thermal insulator 11 and the electronic components 12, 13. In some embodiments, the substrate 10 has a step structure as encircled by a dotted-line circle 10s. For example, the substrate 10 has a top surface 101 and a top surface 102 non-coplanar with the top surface 101. For example, the top surface 102 is recessed from the top surface 101.

The insulator (also can be referred to as a thermal insulator or a support component) 11 is disposed over a surface 103 of the substrate 10. The insulator 11 is disposed within the cavity 10c defined by the substrate 10. In some embodiments, the insulator 11 is connected to the surface 103 of the substrate 10 through an adhesive layer 11a (e.g., a die attach film, DAF). In some embodiments, a thermal conductivity of the insulator 11 is equal to or less than about 1.2 $W \cdot m^{-1} \cdot K^{-1}$. In some embodiments, the thermal conductivity of the insulator 11 is about 0.2 $W \cdot m^{-1} K^{-1}$. For example, the insulator 11 may include a glass material or any other suitable materials.

The electronic component 12 is disposed over the insulator 11. In some embodiments, the electronic component 12 may be or include an active component, such as a die or a chip. The electronic component 12 has a backside surface facing the insulator 11 and an active surface opposite to the insulator 11. In some embodiments, the backside surface of the electronic component 12 is connected to the insulator through an adhesive layer 12a. In other embodiments, the backside surface of the electronic component 12 directly contacts the insulator 11. To effectively provide a thermal insulation for the electronic component 12, a width (or an area) of the backside surface of the electronic component 12 is equal to or less than a width (or an area) of the insulator 11. For example, the backside surface of the electronic component 12 is completely covered by the insulator 11 or the adhesive layer 12a.

The electronic component 12 may include a control circuit configured to control the electronic component 13 and/or to process the signal received from the electronic component 13. In some embodiments, the electronic component 12 further includes a heat source region 12h in proximal to the active surface of the electronic component 12. The heat source region 12h may include a resistor pattern exposed from the active surface and ready to conduct heat to an object in physical contact therewith provided with suitable electrical power. In some embodiments, the electronic component 12 may be electrically connected to the substrate 10 through a conductive wire 12w.

The electronic component 13 is disposed over the electronic component 12. In some embodiments, the electronic component 13 is disposed over the heat source region 12h of the electronic component 12. The electronic component 13 is electrically coupled to the electronic component 12 via a conductive wire 13w. Of course, other electrical connections such as conductive vias, conductive pillars, or solder joints can be applied to electrically connect the electronic component 12, the electronic component 13, and the substrate 10. The electronic component 13 has an active surface facing away from the electronic component 12 and a backside surface opposite to the active surface. In some embodiments, the backside surface of the electronic component 13 is connected to or bonded to the active surface of the electronic component 12 through a bonding layer 13a (e.g., a DAF). The bonding layer 13a may be thin enough to allow effective heat conduction between the heat source region 12h and the electronic component 13. The bonding layer 13a may also possess high thermal conductivity material.

In some embodiments, the electronic component 13 may be or include an oscillator, such as a crystal oscillator or a microelectromechanical system (MEMS) oscillator chip which can be controlled by the underlying control chip (e.g., the electronic component 12). In some embodiments, the electronic component 12 is configured to maintain a constant temperature of the electronic component 13 by the heat source region 12h.

The lid 14 is disposed on the surface 101 of the substrate 10, covering the insulator 11, the electronic components 12, 13 and the cavity 10c. In some embodiments, the space defined by the lid 14 and the cavity 10c is hermetically sealed. For example, the space is insulated from the outside of the semiconductor package structure 1, which can enhance the thermal insulation in the space.

Figure 2A:
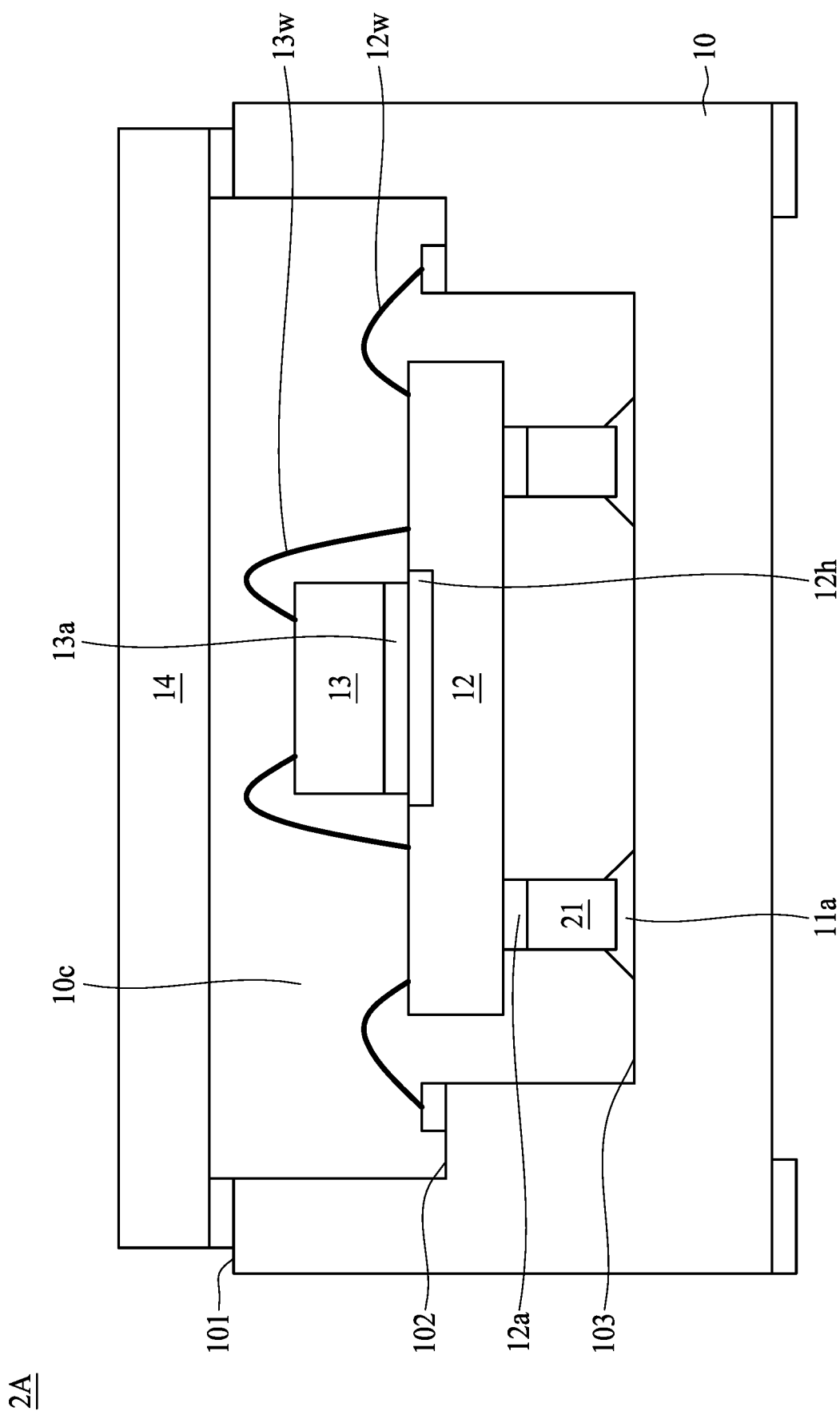
FIG. 2A illustrates a cross-sectional view of a semiconductor package structure, according to some embodiments of the present disclosure.

FIG. 2A illustrates a cross-sectional view of a semiconductor package structure 2A, in accordance to some embodiments of the present disclosure. The semiconductor package structure 2A is similar to the semiconductor package structure 1 as shown in FIG. 1, and some of the differences therebetween are described below.

The substrate 10 in FIG. 2A may be or include a ceramic substrate. For example, the substrate 10 may be formed of Al₂O₃. In some embodiments, the thermal conductivity of the ceramic substrate is about 15 $W·m^{-1}·K^{-1}$. Compared with the organic substrate, the ceramic substrate has a higher stability. The organic substrate may have a gas leakage issue. For example, under the operation temperature, some of the organic gas may be volatilized from the organic substrate, which would change the composition of the air within the space defined by the lid 14 and the substrate 10 and adversely affect the performance (e.g., the precision of the oscillation frequency) of the electronic component 13. In addition, the volatilized organic gas may damage the components (e.g., the electronic components 12 and 13) within the space defined by the lid 14 and the substrate 10 and reduce the lifetime of the semiconductor package structure. In accordance with the embodiments as shown in FIG. 2A, since the ceramic substrate is relatively stable under the operation temperature within the space defined by the lid 14 and the substrate 10, no gas (e.g., organic gas) would be volatilized. Hence, the electronic component 13 can have a better performance (e.g., the precise oscillation frequency). In addition, the lifetime of the semiconductor package structure 2A can be increased.

Referring to FIG. 2A, one or more insulators 21 are disposed between the electronic component 12 (e.g., the backside surface of the electronic component 12) and the substrate 10. The insulators 21 may act as a support structure to support the electronic component 12. The insulators 21 are connected to the surface 103 of the substrate 10 through the adhesive layer 11a. In some embodiments, the insulators 21 are connected to the backside surface of the electronic component 21 through the adhesive layer 12a. In other embodiments, the adhesive layer 12a may be omitted, and the insulators 21 are directly in contact with the backside surface of the electronic component 12. For example, the insulators 21 may be or include a patterned photoresist disposed on the backside surface of the electronic component 12. In some embodiments, a thermal conductivity of the insulator 21 is equal to or less than about 1.2 $W·m^{-1}·K^{-1}$. In some embodiments, the thermal conductivity of the insulator 11 is about 0.2 $W·m^{-1}K^{-1}$. For example, the insulator 21 may include a glass material or any other suitable materials. In some embodiments, the insulators 21 may include or be formed of the same material. Alternatively, the insulators 21 may include or be formed of different materials. For example, some of the insulators 21 may include one material, and the other insulators 21 may include another material.

Figure 2B:
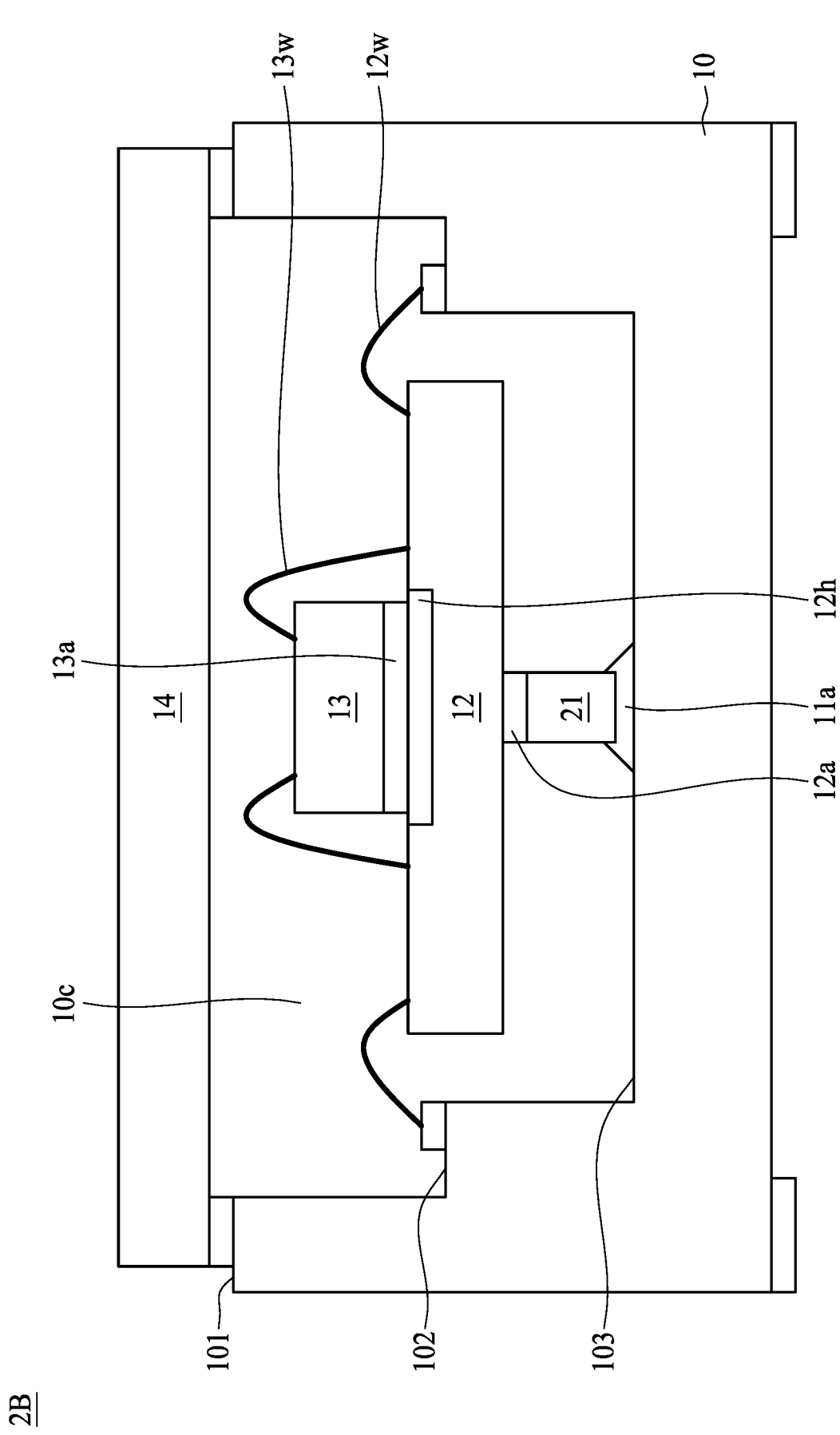
FIG. 2B illustrates a cross-sectional view of a semiconductor package structure, according to some embodiments of the present disclosure.

In some embodiments, each insulator 21 may be a pillar (or a post) or any other shapes of support structure. As shown in FIG. 2A, the insulators 21 may be disposed at or near the periphery of the backside surface of the electronic component 12. In some embodiments, the insulators 21 may fully surround the backside surface of the electronic component 12. For example, the backside surface of the electronic component 12, the surface 103 of the substrate 10 and the insulators 21 may form a sealed space. In some embodiments, the insulators 21 may be separated from each other. For example, there may be a gap between two adjacent insulators 21. In some embodiments, the insulators 21 may be disposed at or near the center of the electronic component 12 as shown in FIG. 2B. In some embodiments, a geometric center of all the insulators 21 is substantially aligned with a geometric center of the electronic component 12. In some embodiments, a height of each of the insulators 21 (or a distance between the backside surface of the electronic component 12 and the surface 103 of the substrate 10) is in a range from about 15 micrometers to about 500 micrometers.

The insulators 21 are connected to a portion of the backside surface of the electronic component 12. For example, a portion of the backside surface of the electronic component 12 is connected to the insulators 21, while the other portion of the backside surface of the electronic component 12 is exposed from the insulators 21 (or exposed to the space defined by the lid 14 and the substrate 10). For example, a total area of top surfaces of all the insulators 21 is less than an area of the backside surface of the electronic component 12. In some embodiments, a total area of top surfaces of all the insulators is about 3% to about 50% (e.g., about 6%, 10%, 15%, 20%, 25%, 30%, 40% or the like) of an area of the backside surface of the electronic component 12. The thermal conduction between the backside surface of the electronic component 12 and the substrate 10 may be achieved by two paths, one including the insulators 21 (or the insulators 21 and the adhesive layers 11a, 12a) and the other including the space (e.g., air, gas or vacuum) between a portion of the backside surface of the electronic component 12 that is not connected to the insulators 21 and the surface 103 of the substrate 10.

In some embodiments, an equivalent thermal resistance (e.g., the equivalent thermal resistance of the insulators 21 and the cavity/space between a portion of the backside surface of the electronic component 12 that is not connected to the insulators 21 and the surface 103 of the substrate 10) between the backside surface of the electronic component 12 and the surface 103 of the substrate 10 is less than a thermal resistance of the substrate 10.

As shown in FIG. 1, since the insulator 11 is connected to the entire backside surface of the electronic component 12, the thermal conduction between the backside surface of the electronic component 12 and the substrate 10 can be achieved by only one path (e.g., the insulator 11). Hence, the equivalent thermal conductivity (or the equivalent thermal resistance) between the backside surface of the electronic component 12 and the substrate 10 is substantially equal to the thermal conductivity (or the equivalent thermal resistance) of the insulator 11. In accordance with the embodiments as shown in FIG. 2A and FIG. 2B, the thermal conduction between the backside surface of the electronic component 12 and the substrate 10 can achieved by the insulators 21 and the air (or vacuum). Since the thermal conductivity of the air is about 0.026 $W·m^{-1}K^{-1}$, the equivalent thermal conductivity between the backside surface of the electronic component 12 and the substrate 10 is less than the thermal conductivity of the insulators 21, or the equivalent thermal resistance between the backside surface of the electronic component 12 and the substrate 10 is greater than the thermal resistance of the insulators 21. Hence, compared with the semiconductor package structure 1 as shown in FIG. 1, the thermal insulation within the space defined by the lid 14 and the substrate 10 of the semiconductor package structure 2A or 2B can be improved, which would improve the performance of the electronic component 13 (e.g., the precise oscillation frequency). In addition, the semiconductor package structure 2A or 2B has better thermal insulation, the power consumption of the electronic component 12 to heat the electronic component 13 at the operation temperature can be reduced.

In some embodiments, in the case that the thickness of the insulator 11 and the height of each insulator 21 is about 500 micrometer, the thermal resistance between the backside surface of the electronic component 12 and the surface 103 of the substrate of the semiconductor package structure 2A (a total area of the insulators is about 6% of the area of the backside surface of the electronic component 12) is about 186% higher than that of the semiconductor package structure 1, and the thermal resistance between the backside surface of the electronic component 12 and the surface 103 of the substrate of the semiconductor package structure 2B (a total area of the insulator is about 3% of the area of the backside surface of the electronic component 12) is about 357% higher than that of the semiconductor package structure 1. In addition, the power consumption of the electronic component 12 of the semiconductor package structure 2A is about 65% less than that of the semiconductor package structure 1, and the power consumption of the electronic component 12 of the semiconductor package structure 2B is about 78% less than that of the semiconductor package structure 1.

In some embodiments, in the case that the thickness of the insulator 11 and the height of each insulator 21 is about 200 micrometer, the thermal resistance between the backside surface of the electronic component 12 and the surface 103 of the substrate of the semiconductor package structure 2A (a total area of the insulators is about 6% of the area of the backside surface of the electronic component 12) is about 302% higher than that of the semiconductor package structure 1, and the thermal resistance between the backside surface of the electronic component 12 and the surface 103 of the substrate of the semiconductor package structure 2B (a total area of the insulators is about 3% of the area of the backside surface of the electronic component 12) is about 525% higher than that of the semiconductor package structure 1. In addition, the power consumption of the electronic component 12 of the semiconductor package structure 2A is about 75% less than that of the semiconductor package structure 1, and the power consumption of the electronic component 12 of the semiconductor package structure 2B is about 84% less than that of the semiconductor package structure 1.

Figure 3:
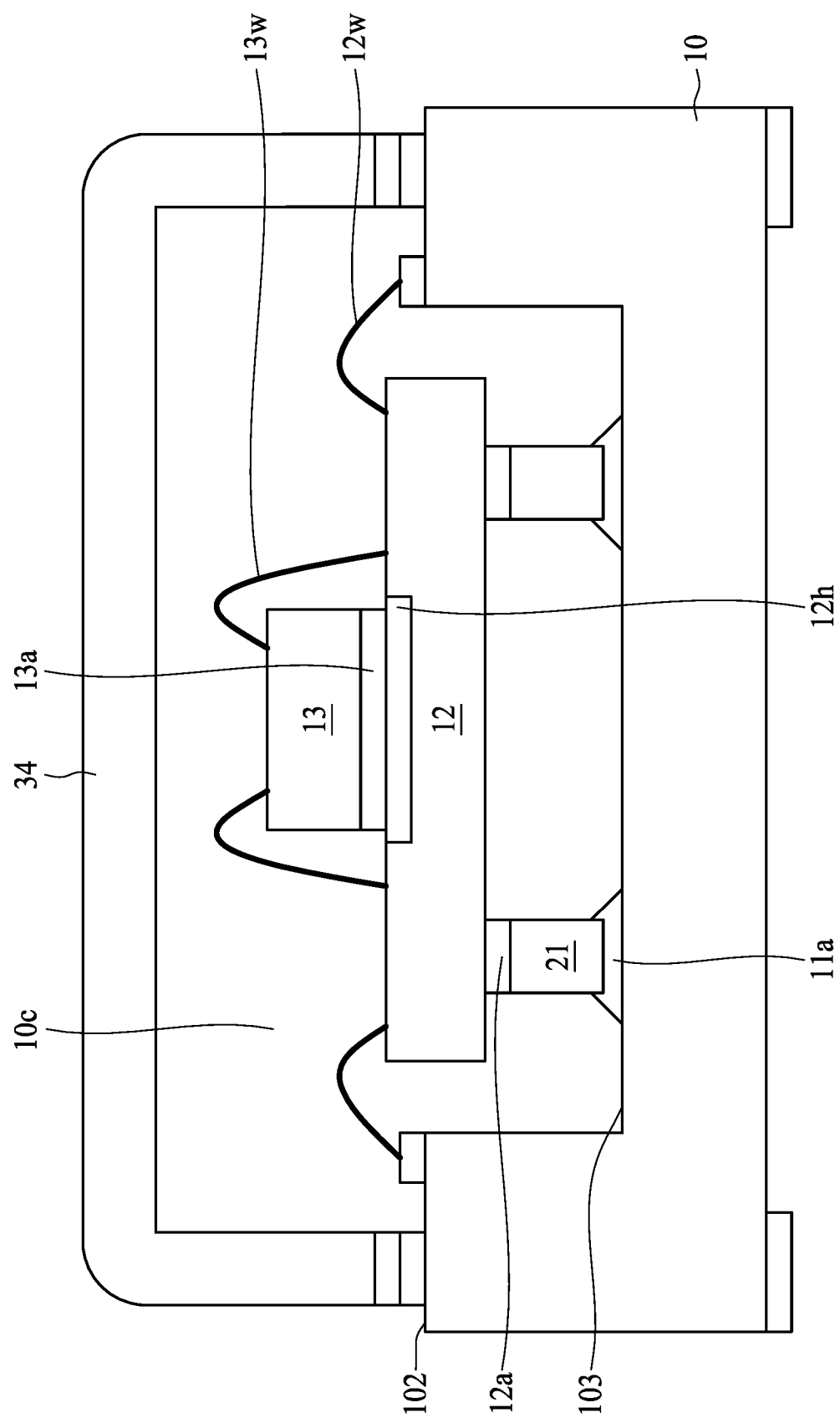
FIG. 3 illustrates a cross-sectional view of a semiconductor package structure, according to some embodiments of the present disclosure.

FIG. 3 illustrates a cross-sectional view of a semiconductor package structure 3, in accordance to some embodiments of the present disclosure. The semiconductor package structure 3 is similar to the semiconductor package structure 2A as shown in FIG. 2A, and some of the differences therebetween are described below.

As shown in FIG. 3, the substrate 10 does not include a step structure as shown in FIG. 2A. For example, the substrate 10 includes only one top surface 102. A lid 34 has a first portion substantially parallel to the surface 103 of the substrate 10 and a second portion connected to the first portion and substantially perpendicular to the first portion. The second portion of the lid 34 is disposed on the surface 102 of the substrate 10. In FIG. 2A, the electronic component 13 does not overlap the lid 14 in a direction substantially parallel to the surface 103 of the substrate 10. In FIG. 3, the electronic component 13 may overlap the lid 34 (e.g., the second portion of the lid 34) in a direction substantially parallel to the surface 103 of the substrate 10.

Figure 4A:
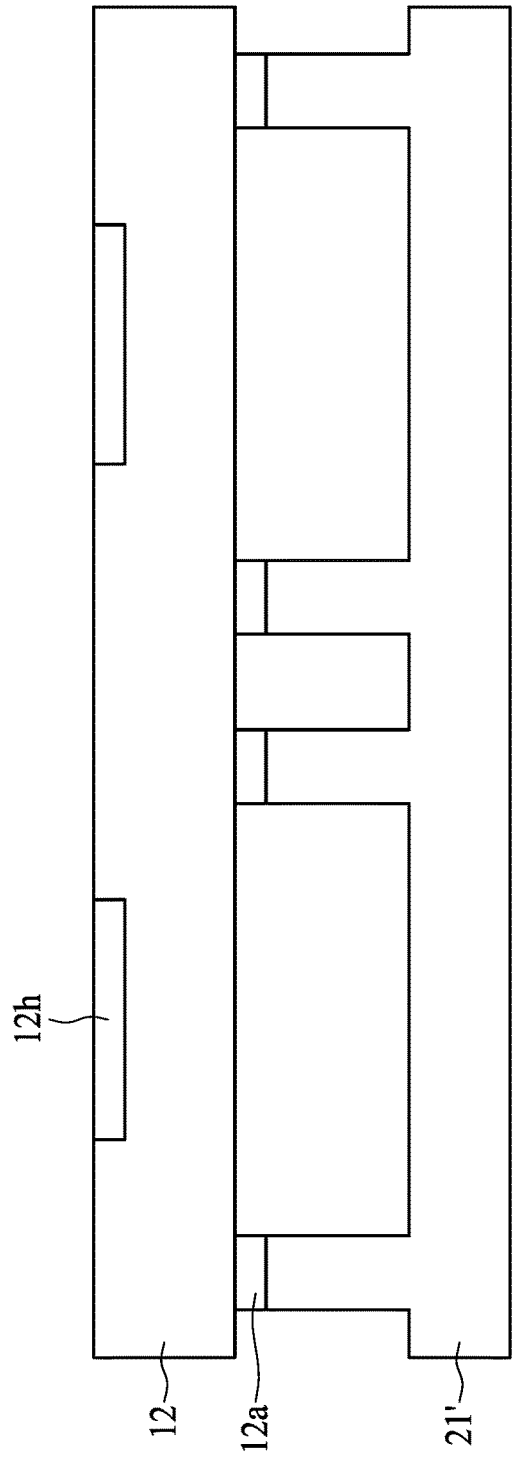
FIG. 4A, FIG. 4B, FIG. 4C, FIG. 4C'.
Figure 4B:
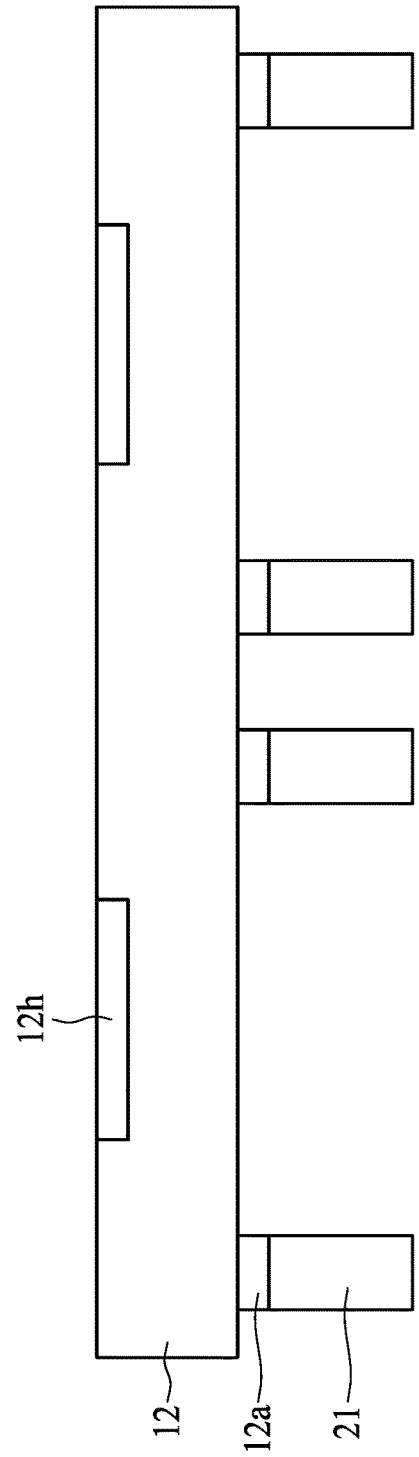
Figure 4C:
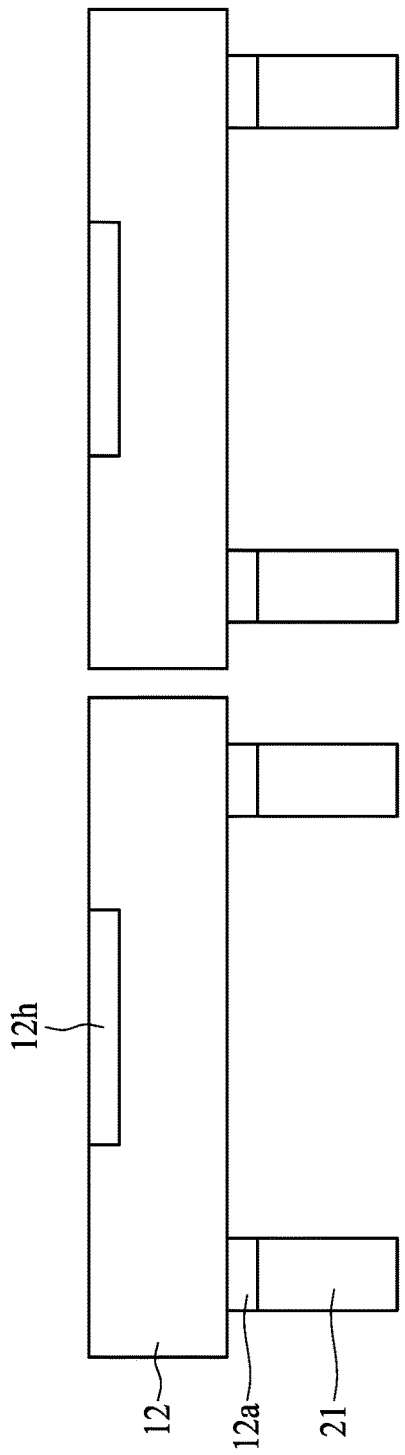
Figure 4C:
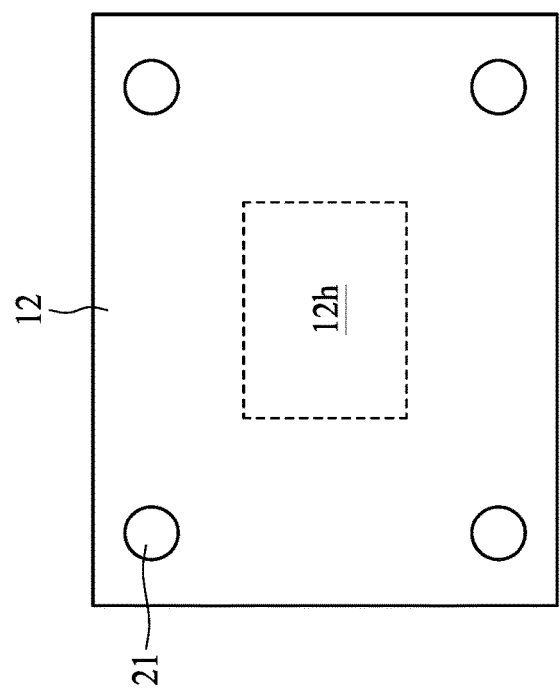
Figure 4D:
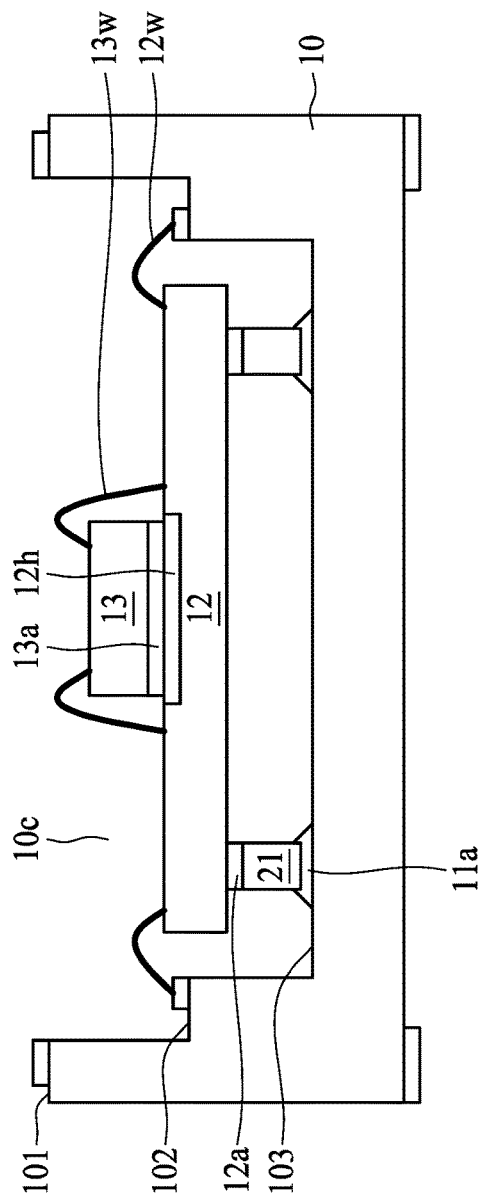
FIG. 4D and FIG. 4E illustrate a method of manufacturing a semiconductor package structure, according to some embodiments of the present disclosure.
Figure 4E:
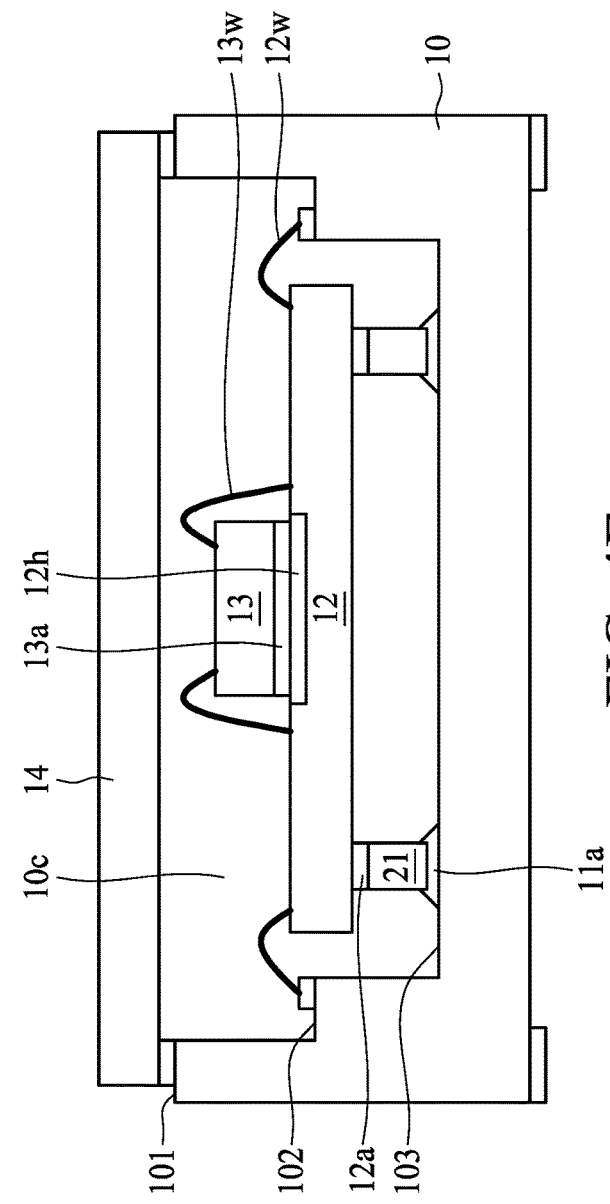

FIG. 4A, FIG. 4B, FIG. 4C, FIG. 4C', FIG. 4D and FIG. 4E illustrate a method of manufacturing a semiconductor package structure 2A as shown in FIG. 2A, in accordance with some embodiments of the present disclosure.

Referring to FIG. 4A, a plurality of electronic components including the electronic component 12 are provided. In some embodiments, the electronic components may be in a strip form or a wafer form. An insulator 21' having a first portion substantially parallel to the backside surface (e.g., the surface facing away from the heat source region 12h) of the electronic component 12 and a second portion connected to the first portion and substantially perpendicular to the first portion is provided. The second portion of the insulators 21' is connected to the backside surface of the electronic components including the electronic component 12 through, for example, the adhesive layer 12a.

Referring to FIG. 4B, the first portion of the insulator 21' is removed to leave the second portion of the insulator 21' to form a plurality of insulators 21. In some embodiments, the first portion of the insulator 21' is removed by, for example, etching or any other suitable processes.

In other embodiments, the insulators 21 may be formed by patterning a photoresist of the backside surface of the electronic components including the electronic component 12, and the adhesive layer 12a may be omitted.

Referring to FIG. 4C, singulation may be performed to separate out individual electronic components including the electronic component 12. The singulation may be performed, for example, by using a dicing saw, laser or other appropriate cutting technique.

As shown in FIG. 4C', which illustrate a bottom view of the electronic component 12 shown in FIG. 4C, the insulators 21 may be disposed at or near the corners of the backside surface of the electronic component 12. In other embodiments, the insulators 21 may be disposed at or near the center of the backside surface of the electronic component 12. The number of the insulator 21 may be changed depending on different design specifications.

Referring to FIG. 4D, a substrate 10 having a cavity 10c is provided. The structure as shown in FIG. 4C is disposed within the cavity 10c. The insulators 21 are connected to the surface 103 of the substrate 10 through the adhesive layer 11a. The electronic component 13 is then disposed on the active surface (e.g., on the heat source region 12h) of the electronic component 12. The electronic components 13 is electrically connected to the electronic component 12 through a conductive wire 13w. The electronic components 12 is electrically connected to the substrate 10 through a conductive wire 12w.

Referring to FIG. 4E, a lid 14 is disposed on the surface 101 of the substrate. The lid 14 is connected to the surface 101 of the substrate 10 to form a hermetically sealed space.

Figure 5A:
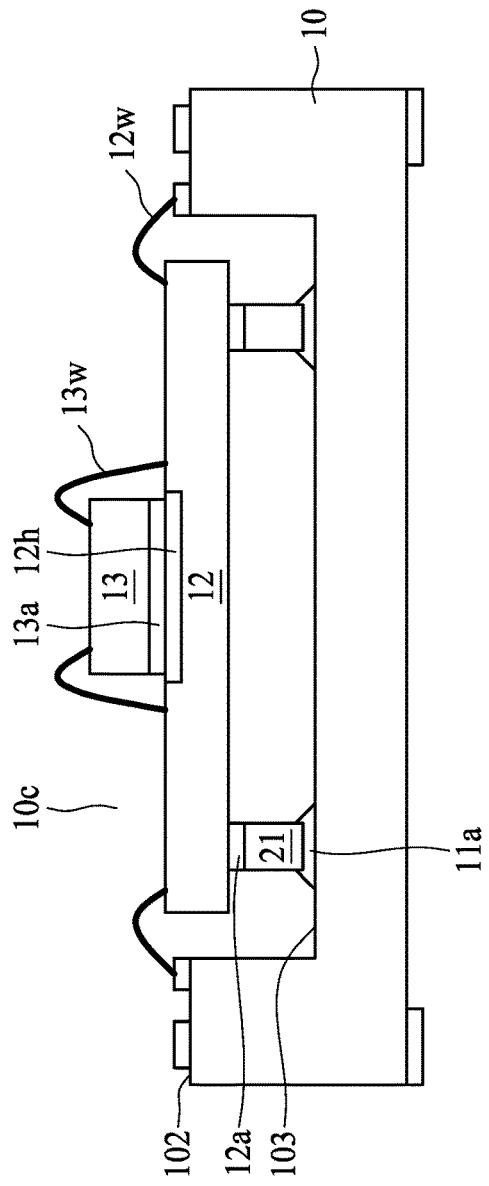
FIG. 5A and FIG. 5B illustrate a method of manufacturing a semiconductor package structure, according to some embodiments of the present disclosure.
Figure 5B:
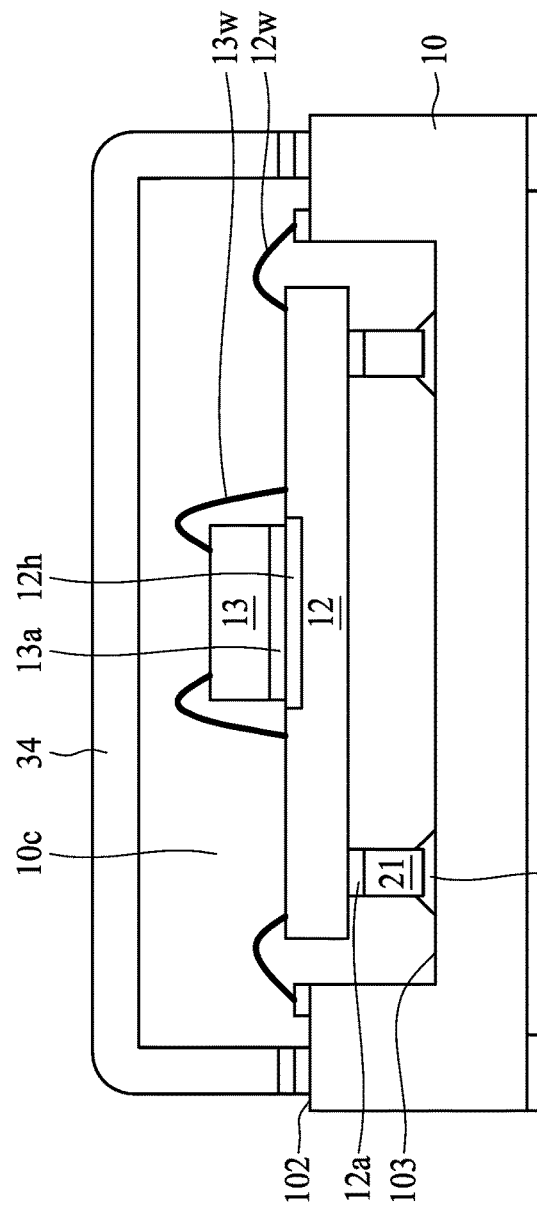

FIG. 5A and FIG. 5B illustrate a method of manufacturing a semiconductor package structure 3 as shown in FIG. 3, in accordance with some embodiments of the present disclosure. In some embodiments, the operations in FIG. 5A may be carried out after the operations in FIG. 4C. The operations in FIG. 5A and FIG. 5B are similar to those in FIG. 4D and FIG. 4E, and some of the differences are described below.

As shown in FIG. 5A, the substrate 10 does not include a step structure as shown in FIG. 4D. For example, the substrate 10 includes only one top surface 102. As shown in FIG. 5B, a lid 34 has a first portion substantially parallel to the surface 103 of the substrate 10 and a second portion connected to the first portion and substantially perpendicular to the first portion. The second portion of the lid 34 is disposed on the surface 102 of the substrate 10 to form a hermetically sealed space.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. An electronic package structure, comprising:
   a carrier;
   a first electronic component disposed adjacent to the carrier, wherein the first electronic component comprises a heat source region configured to maintain a constant temperature of a second electronic component which is disposed over the heat source region, and a backside surface of the second electronic component is thermally connected to the heat source region by a thermal bonding layer; and
   a wire electrically connecting the first electronic component and the carrier, wherein the wire has a first end and a second end opposite to the first end, and the first end is substantially at a same level with the second end, wherein the second end of the wire is on the carrier and below a top surface of the carrier.

2. The electronic package structure as claimed in claim 1, wherein the heat source region is embedded in the first electronic component and exposed from an active surface of the first electronic component.

3. The electronic package structure as claimed in claim 2, wherein a surface of the heat source region is substantially coplanar with the active surface of the first electronic component.

4. The electronic package structure as claimed in claim 1, wherein a portion of the heat source region is exposed from the thermal bonding layer.

5. The electronic package structure as claimed in claim 4, wherein a width of the second electronic component is less than a width of the heat source region.

6. An electronic package structure, comprising
   a carrier;
   a first electronic component disposed adjacent to the carrier, wherein the first electronic component comprises a heat source region configured to maintain a constant temperature of a second electronic component which is disposed over the heat source region, and a backside surface of the second electronic component is thermally connected to the heat source region by a thermal bonding layer; and
   a support component disposed between the first electronic component and the carrier, wherein a projection of the support component on the carrier and a projection of the heat source region on the carrier overlap in a vertical direction.

7. The electronic package structure as claimed in claim 6, wherein a width of the support component is less than a width of the heat source region.

8. The electronic package structure as claimed in claim 6, further comprising a wire electrically connecting the first electronic component and the second electronic component.

9. The electronic package structure as claimed in claim 8, wherein the wire has a first end on the second electronic component, and a projection of the first end is within an area of the heat source region in a vertical direction.

10. The electronic package structure as claimed in claim 9, wherein the wire further has a second end on the first electronic component, and the second end is spaced apart from the heat source region.

* * * * *